(12) United States Patent
Mitric et al.

(10) Patent No.: US 9,584,138 B2
(45) Date of Patent: Feb. 28, 2017

(54) PHASE LOCKED LOOP WITH ACCURATE ALIGNMENT AMONG OUTPUT CLOCKS

(71) Applicant: Microsemi Semiconductor ULC, Kanata (CA)

(72) Inventors: Krste Mitric, Ottawa (CA); Qu Gary Jin, Kanata (CA); Guohui Situ, Stittsville (CA); Paul H. L. M. Schram, Bergen op Zoom (NL); Changhui Cathy Zhang, Ottawa (CA); Richard Geiss, Kanata (CA)

(73) Assignee: Microsemi Semiconductor ULC, Kanata, Ontario (CA)

( * ) Notice: Subject to any disclaimer, the term of this patent is extended or adjusted under 35 U.S.C. 154(b) by 0 days.

(21) Appl. No.: 15/091,269

(22) Filed: Apr. 5, 2016

(65) Prior Publication Data
US 2016/0301417 A1  Oct. 13, 2016

Related U.S. Application Data

(60) Provisional application No. 62/144,955, filed on Apr. 9, 2015.

(51) Int. Cl.
| | |
|---|---|
| *H03L 7/06* | (2006.01) |
| *H03L 7/07* | (2006.01) |
| *H03L 7/23* | (2006.01) |
| *H03L 7/099* | (2006.01) |
| *H03L 7/093* | (2006.01) |
| *H04L 5/06* | (2006.01) |

(52) U.S. Cl.
CPC ............. *H03L 7/07* (2013.01); *H03L 7/093* (2013.01); *H03L 7/0991* (2013.01); *H03L 7/23* (2013.01); *H04L 5/06* (2013.01)

(58) Field of Classification Search
None
See application file for complete search history.

(56) References Cited

U.S. PATENT DOCUMENTS

| | | | | |
|---|---|---|---|---|
| 2004/0201405 A1* | 10/2004 | Bacha | ........................ | G06F 1/10 327/156 |
| 2013/0076415 A1* | 3/2013 | Hara | ...................... | H03L 7/1974 327/159 |
| 2014/0021989 A1* | 1/2014 | Kuo | .......................... | H03L 7/07 327/157 |
| 2016/0299870 A1* | 10/2016 | Mitric | ................. | G06F 13/4291 |

* cited by examiner

*Primary Examiner* — Cassandra Cox
(74) *Attorney, Agent, or Firm* — Simon Kahn (57) ABSTRACT

A multi-channel phase locked loop (PLL) device has a plurality of PLL channels. Each channel includes a digitally controlled oscillator (DCO) supplying an output clock, via an output divider, to a respective output pin. A first multiplexer selects any of the PLL channels for alignment. A feedback calibration PLL is responsive to a feedback signal derived from an output clock of a selected channel at the respective output pin. A delay control module is responsive to an output of the feedback calibration PLL to adjust the phase of the output clock.

22 Claims, 5 Drawing Sheets

PRIOR ART

PHASE LOCKED LOOP WITH ACCURATE ALIGNMENT AMONG OUTPUT CLOCKS

CROSS REFERENCE TO RELATED APPLICATION

This application claims the benefit under 35 USC 119 (e) of U.S. provisional application No. 62/144,955, the contents of which are herein incorporated by reference.

FIELD OF THE INVENTION

This invention relates to the field of precision timing, and in particular to a method that allows accurate alignment among output clocks and between selected reference clock and any output clock, regardless of pin type, voltage and temperature variations. The method is more efficient if implemented in a single device due to the ability to save device pins, but it can also be used in a multi-device clock synchronization system.

BACKGROUND OF THE INVENTION

Figure 1:
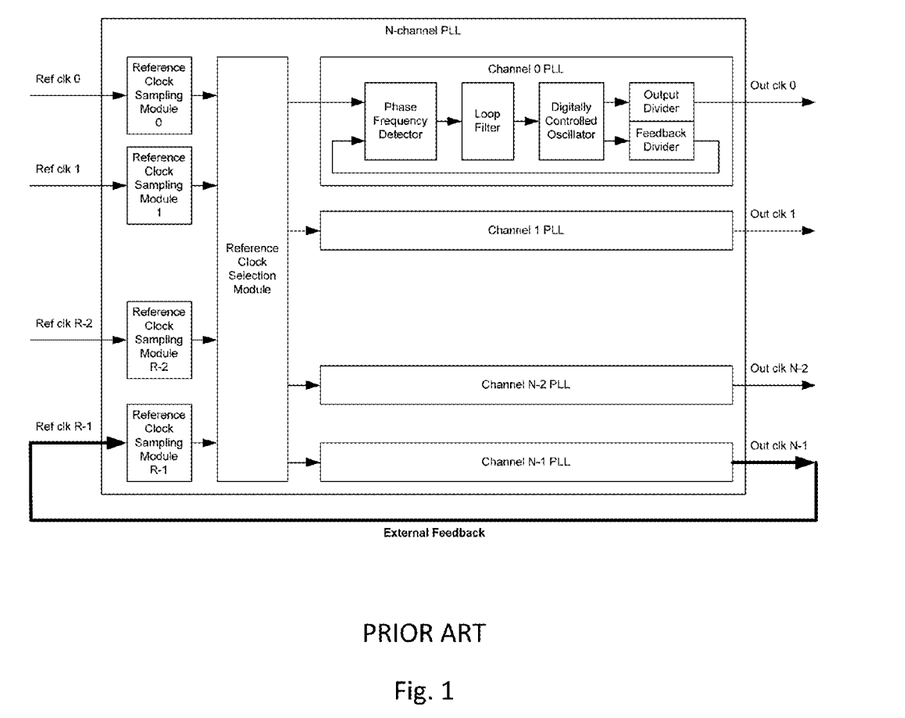
FIG. 1 is a block diagram of a prior art system using an external feedback, requiring dedicated resources.

In addition to frequency synchronization, the main role of most phase locked loops (PLLs) is phase alignment. Any type II PLL (e.g. a PLL having two integrators in the loop) should be capable of maintaining phase alignment between its selected reference clock and output clocks to a certain limit. The delay variation of the reference clock and output clock pins, as well as the interconnection lines, limits the alignment accuracy. For applications that are sensitive to such alignment variations, i.e. for applications that require accurate alignment to be maintained over process, voltage and temperature variations, different compensation mechanisms have been provided. A prior art solution for maintaining alignment accuracy is the use of external feedback as shown in FIG. 1.

An important disadvantage of the prior art is the lack of flexibility as a result of the expensive resources needed to support proper alignment. To be able to independently control the alignment of each output, the prior art solution would require as many external feedback connections as the number of output clocks, or at least as the number of output pin types. Each external feedback connection requires its own reference sampling module and PLL, as well as independent input and output pins. This would be very expensive, and in most cases the practical prior art solution is to provide only a single external feedback connection. The lack of a separate external feedback connection for each output clock limits the alignment accuracy that can be maintained due to different loading per output clock and the delay changes caused by voltage and temperature variations.

It is also important to note the technical difficulty, or inability, of the prior art solutions to maintain proper alignment among different types of output pins (single ended vs. differential) due to the different delay variation over voltage and temperature unless each output has its own feedback line.

SUMMARY OF THE INVENTION

Embodiments of the invention resolve the problems of the prior art by offering the ability to independently monitor and correct the delay of each output clock, including the delay caused by different output clock loading, as well as the delay variations caused by voltage and temperature variations without the need to use additional pins and other expensive resources such as an additional reference sampling module and PLL per output clock. Accurate input to output alignment to within +/−500 ps may be achieved.

According to the present invention there is provided a multi-channel phase locked loop (PLL) device, comprising: a plurality of PLL channels, each comprising a digitally controlled oscillator (DCO) supplying an output clock, via an output divider, to a respective output pin; a first multiplexer for selecting any of said PLL channels for alignment; a feedback calibration PLL responsive to a feedback signal derived from a said output clock of a selected channel at the respective output pin; and a delay control module responsive to an output of the feedback calibration PLL to adjust a phase of said output clock.

Each PLL channel can have multiple dividers providing multiple output clocks in which case the first multiplexer can select any of the output clocks from any PLL channel.

The delay control module can both advance and delay the phase of the output clock. In particular, it may effect coarse adjustment by controlling output dividers in the PLL channel, and fine adjustment by controlling the DCO in the PLL channel.

Although generally applicable to a multi-channel device, the invention could in theory also be applied to a single channel PLL.

Embodiments of the invention allow PLLs to achieve very accurate alignment among the output clocks and between selected input reference clock and any related output clock without using input and output pins. The alignment can be maintained regardless of input and output pin type (single ended LVCMOS, differential CML, LVPEL, LVDS, HCSL, without limitation), voltage and temperature variations. Such alignment is achievable by using a feedback calibration mechanism, which requires every output clock to be routable to the sampling module for accurate phase measurement.

To avoid the need for an impractical number of hardware resources for the sampling of each output clock, all output clocks are multiplexed and only one sampling module is used to sample all output clocks. The multiplexing may be performed using a time division multiplex (TDM) approach, prescribing that every output clock is periodically sampled for specified time duration, depending on its frequency, followed by sampling of the next in line output clock and so on. Each output clock phase is allowed to vary differently, and since every output clock is monitored individually, it is still possible to achieve very accurate alignment among all output clocks and between the selected reference clock and any output clock, by compensating output delay of each output clock individually, based on the measured delay.

Also, due to the periodic (TDM) serving of all outputs, the method allows for on-fly compensation of delay changes due to temperature changes, therefore allowing overall very tight alignment that otherwise is impossible to achieve.

In order to accurately maintain the alignment, the feedback signal from each output clock has to come directly from the output pin, such that the output clock position, which is dependent of pin loading, can be accurately measured. For the measure and compensate process, described above, to be accurate, the output clock adjustment should be equivalent to the measured delay.

Connection lines between output clocks and the sampling module can have different delays, depending on voltage and temperature variations, and the delay variation in the connection lines will directly affect accuracy of the measurement and compensation process. In order to accurately measure the delay of the connection lines, a replica circuit has to be available for each element on the connection lines that significantly contributes to the connection line delay variation. Measuring the delay of the replica circuits requires that each replica circuit be driven by a clock source with a known frequency, it be routed to the sampling module, and that it have ability to be bypassed. The time division multiplex principle is used for measuring the replica circuits' delay and combining it with the measurement of each output clock.

Even though the preferred embodiment is implemented in single device, the concept of accurately aligning any number of output clocks among themselves, as well between a selected reference clock and any other clock by using a feedback calibration mechanism and the time division multiplex principle, can be applied to any synchronization system not limited to a single PLL device. Such system would not be able to benefit from saving device pins, but it certainly would benefit by employing a single sampling module to do the alignment.

An important advantage offered by embodiments of the invention is the ability to align different type of outputs (single ended vs. differential) with different loading.

In another aspect the invention provides a method of aligning output clocks in a multi-channel phase locked loop (PLL), each channel comprising a digitally controlled oscillator (DCO) supplying an output clock, via an output divider, to a respective output pin comprising: selecting said PLL channels for compensation in turn; sending a feedback signal derived from an output clock of a selected channel at a respective output pin to a feedback calibration PLL; and adjusting the phase of the output clock of the selected channel with a delay control module responsive to an output of the feedback calibration PLL.

In yet another aspect the invention provides a method of aligning output clocks in a multi-channel phase locked loop (PLL), each channel comprising a digitally controlled oscillator (DCO) supplying an output clock, via an output divider, to a respective output pin comprising: selecting said PLL channels for compensation in turn; sending a feedback signal derived over a feedback path from an output clock of a selected channel at the respective output pin to a feedback calibration PLL; adjusting the phase of the output clock of the selected channel with a delay control module responsive to an output of the feedback calibration PLL; determining the delay of components in the feedback path by passing known signals through replica components matched to the components in the feedback path and bypassing the replica components; and allowing for the determined delay when adjusting the phase of the output clock.

BRIEF DESCRIPTION OF THE DRAWINGS

This invention will now be described in more detail, by way of example only, with reference to the accompanying drawings, in which.

DETAILED DESCRIPTION OF PREFERRED EMBODIMENTS

Figure 2:
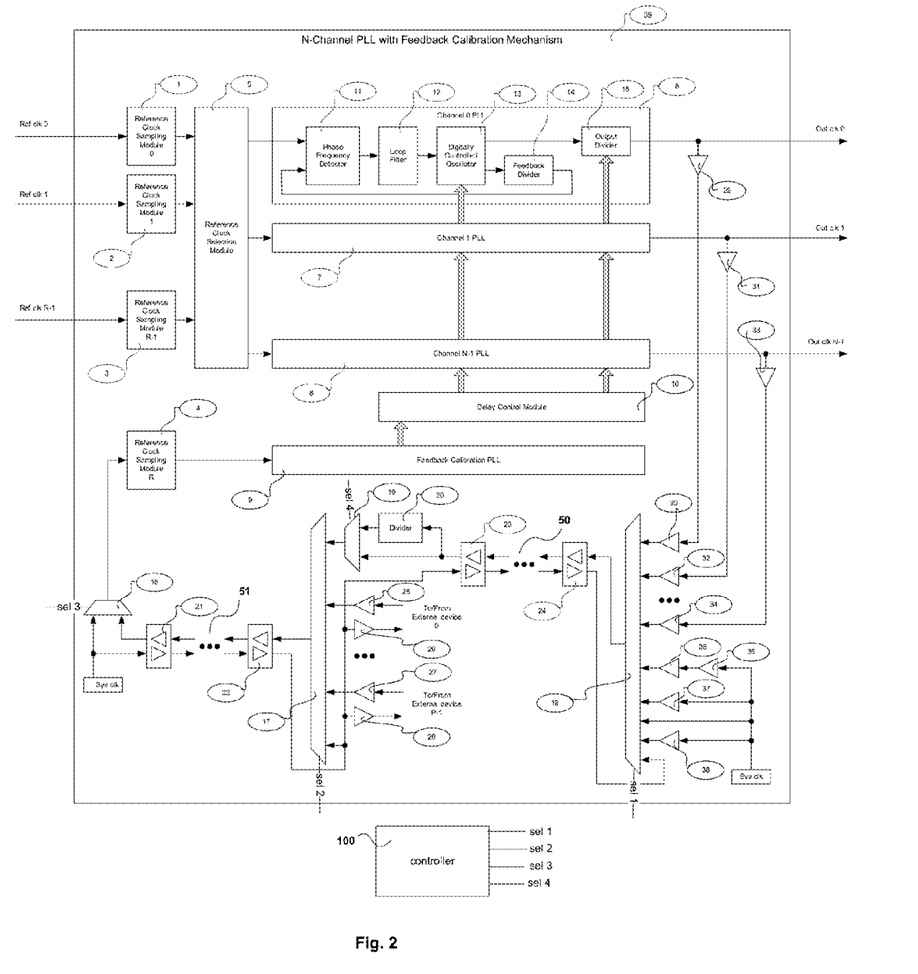
FIG. 2 is a block diagram of an N-channel PLL with a feedback calibration mechanism in accordance with an embodiment of the invention.

As shown in FIG. 2, a feedback calibration mechanism is embodied within an N-channel PLL device 39, allowing very accurate input-to-output and output-to-output alignment. The N-channel PLL device 39 is capable of selecting any of the input references via the reference clock selection module 5 to be used as the synchronization clock source. Prior being selected, each of the R reference clocks is sampled (digitized) using a respective dedicated reference clock sampling module 1, 2, 3.

Each of the N PLLs 6,7,8 forming the N-channel PLL device can select any of the available R references via reference clock selection module 5. More than one PLL can select the same reference clock. In each PLL 6, 7, 8 the selected reference is passed in digital form through a phase frequency detector 11, where it is compared with the phase of a digitized clock signal coming from the feedback divider 14. The output of phase frequency detector 11, comprising a signal representing a phase error between the selected reference clock and the feedback signal from feedback divider 14, is fed to the loop filter 12. The output of loop filter 12, representing a filtered phase error is used to control the phase and frequency of DCO 13. The output divider 15 can generate multiple output clocks that have an integer ratio with a high frequency clock associated with DCO 13. For reasons of simplicity only one output clock per divider is shown.

In addition to changing the output clock phase through control of the respective DCO 13, the phase of each output clock can be changed through a second mechanism responsive to a delay control module 10. The delay control module 10, which is controlled by the feedback calibration PLL 9, may delay or advance every output clock phase with coarse adjustment steps by controlling directly each output divider 15, and/or with fine phase steps by adjusting the DCO 13 phase with significantly higher resolution.

The feedback calibration PLL 9 receives an input signal from reference clock sampling module 4 connected to the output of multiplexer 16 as will be described.

The role of the feedback calibration PLL 9 is to measure the delay of a selected output clock or the system clock, and accordingly compensate for the delay for the appropriate output clock. Before being passed to the feedback calibration PLL 9, the selected output clock or the system clock is sampled in the same way as any other reference clock by the dedicated reference clock sampling module 4.

Controller 100 controls the operation of multiplexers 16, 17, 18 and 19 as will be described in detail below.

The output clock delay measurement is a complex process, consisting of multiple steps, which will be presented below, with the feedback calibration path used for each step highlighted in bold in FIGS. 3 to 5.

Figure 3:
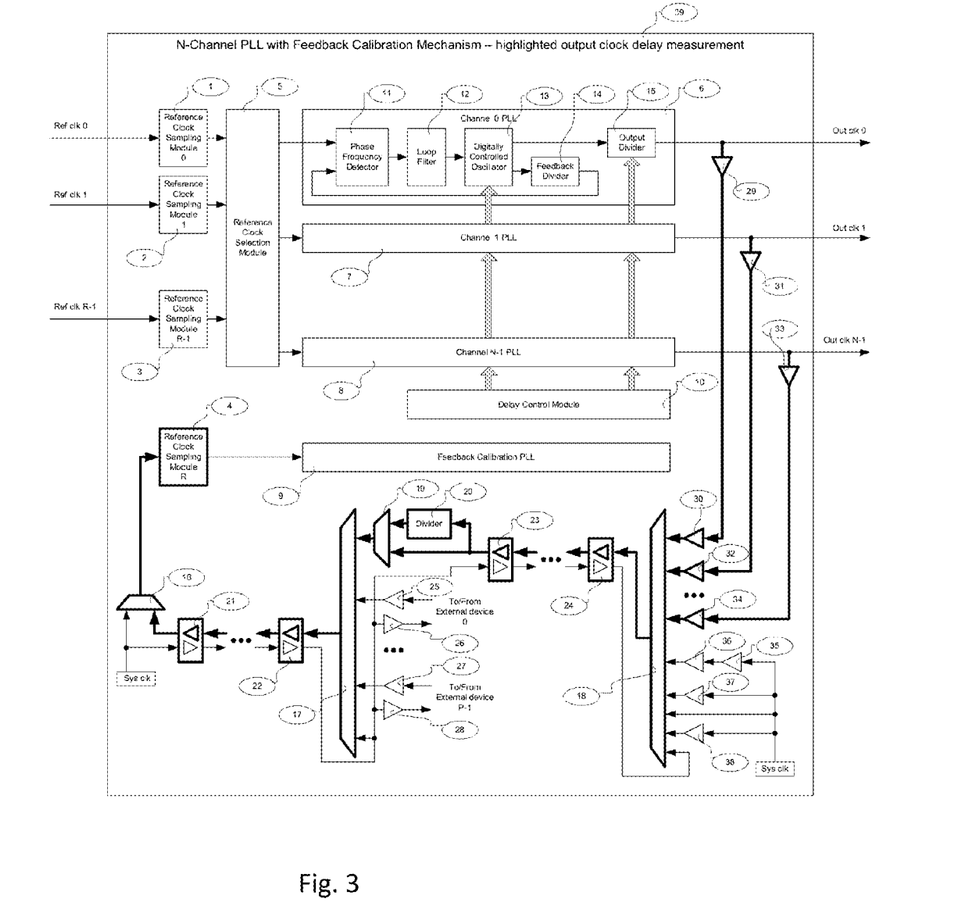
FIG. 3 is a block diagram similar to FIG. 2 without the controller but showing the relevant paths for the measurement of output clock delay highlighted in bold.

Referring first to FIG. 3, each output clock is buffered at the output pin, using the transmit drivers 29, 31, 33, and routed to corresponding receive drivers 30, 32, 34 before reaching first multiplexer 18.

One at a time, each output clock is selected via first multiplexer 18 controlled by controller 100. The Tx/Rx drivers 23, 24 are interconnected by a routing channel comprising matched interconnection lines 50 carrying data in opposite directions. Multiple intermediate matched Tx/Rx drivers (not shown) may be employed if required depending on the length of the routing channel.

The selected output clock is routed via the matched Tx/Rx driver 24 toward the final Tx/Rx driver 23 over the interconnection line carrying data toward the Tx/RX driver 23 before reaching the second multiplexer 17 through multiplexer 19.

The modules and routing channels between the output pins, the second multiplexer 17, and the first multiplexer 18 are implemented using differential (CML) logic in the preferred embodiment.

Very high frequency output clocks need to be divided before exiting the tightly controlled area between the multiplexers 18 and 17, so a divider 20 is added between the final Tx/Rx driver 23 and the second multiplexer 17. The delay through the divider 20 can vary with the voltage and temperature variations, so the ability to measure its delay is provided by adding one more multiplexer 19 following the divider 20 as will be described below. The second multiplexer 17 supports the external feedback mechanism in multi-chip environment, allowing accurate alignment of clocks from different dies within the same package, or from different packages.

From the second multiplexer 17, the signals are driven through routing channels containing matched interconnection lines 51 carrying data in opposite directions and multiple matched Tx/Rx driver cells 22, 21, before hitting the last multiplexer 16 in front of the reference clock sampling module 4 that is used to provide the input to the feedback calibration PLL 9. When the signals are routed as shown in FIG. 3, the feedback calibration PLL 9 measures the phase position of the output clocks.

The measured phase position of the output clocks is the starting point for the compensation delay calculation to be used for each output clock. If the divider 20 is used, then its delay has to be separately measured by alternately passing the lower frequency Sys clock through it and bypassing it when the system clock is routed as shown in bold lines in FIG. 5.

To get the final compensation delay for each output clock, the delays through replica circuits and the delay through interconnection lines have to be determined. The replica circuits match sensitive components on the interconnection path to compensate for the interconnection path delay variation.

Figure 4:
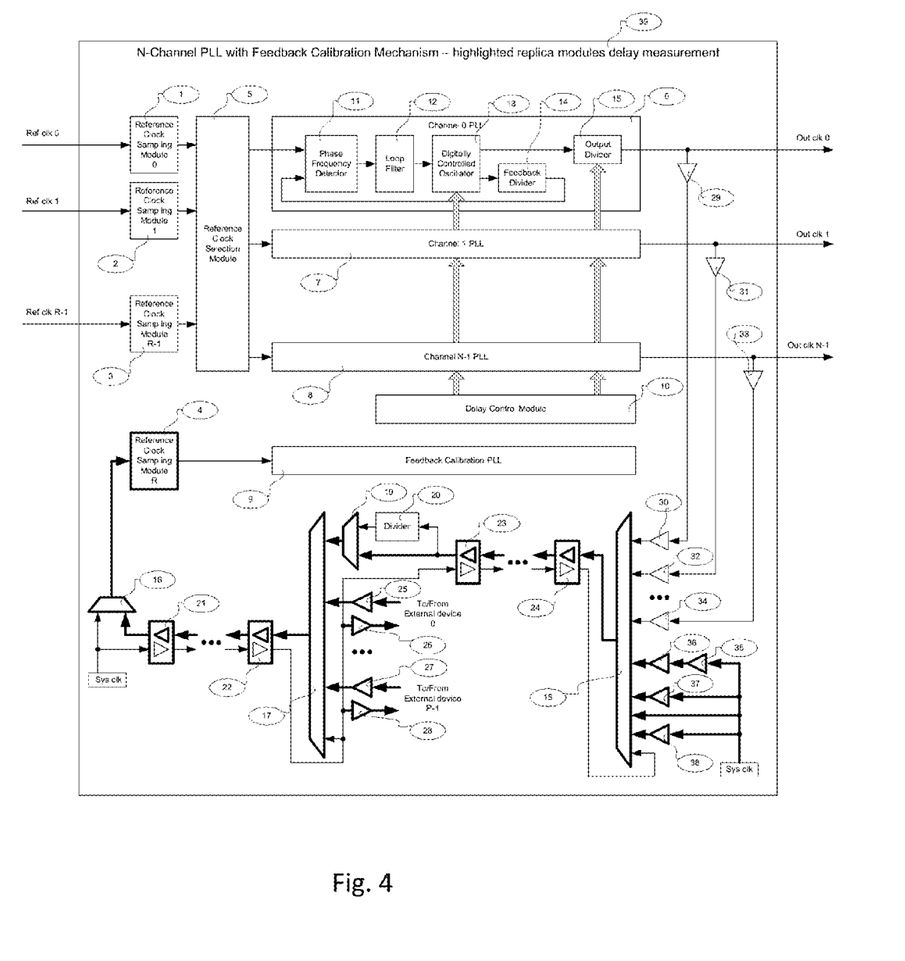
FIG. 4 is a block diagram similar to FIG. 2 without the controller but showing the relevant paths for the measurement for the replica modules delay highlighted in bold.
Figure 5:
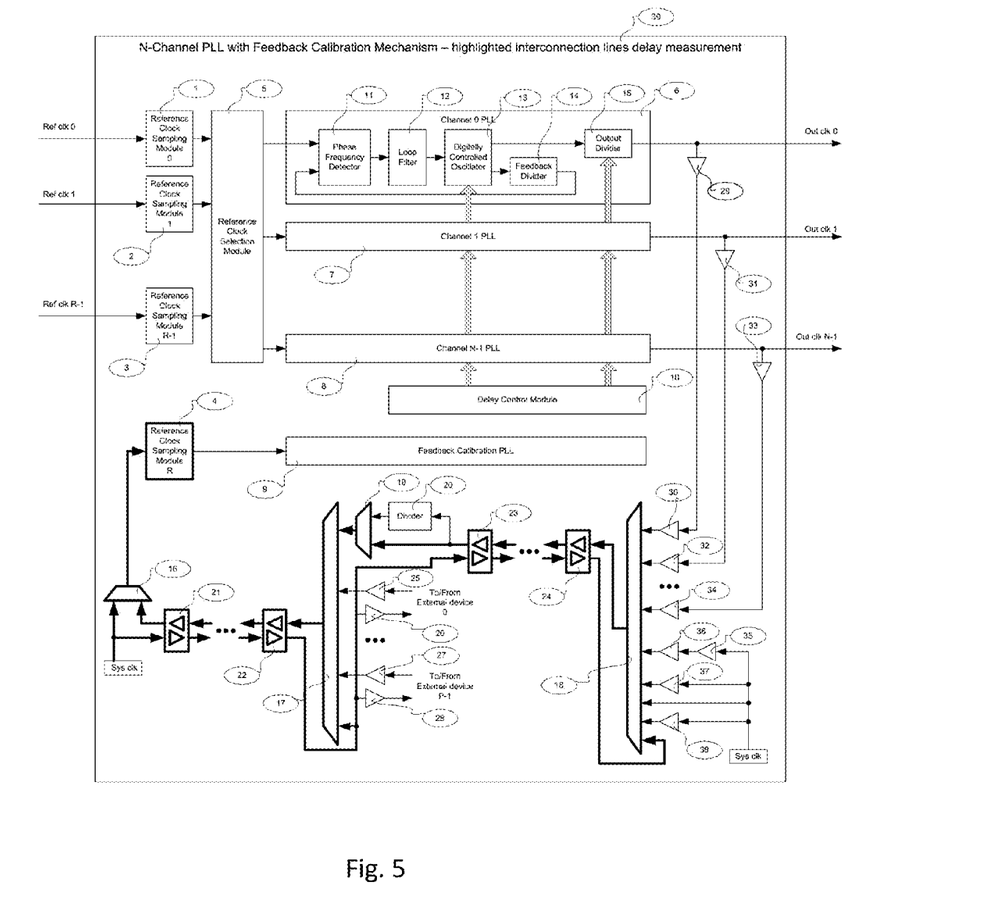
FIG. 5 is a block diagram similar to FIG. 2 without the controller but showing the relevant paths for the measurement of the interconnection paths delay measurement highlighted in bold.

As shown in FIG. 4, a clock of known frequency, such as the Sys clock, is sent to multiplexer 18 through the replica circuits 35, 36 and 37 and directly, bypassing the replica circuits. By the controller 100 selecting the different inputs of the multiplexer 18, with and without the replica circuits, the delays introduced by the replica circuits can be determined As shown by the paths in FIG. 5, the delay introduced by the interconnection lines between pairs of Tx/Rx drivers 23, 24 and 21, 22 can be determined by using matched delay interconnection lines going in opposite directions. To measure the round trip delay the Sys clock is passed through the matched interconnection lines going in the opposite direction, via Tx/Rx driver cells 22, 21, through multiplexer 17, Tx/Rx driver cells 23, 24 to multiplexer 1, and wrapped back through the multiplexer 18 used to select output clock to be measured, and passed through the reference sampling module 4 to the feedback calibration PLL 9.

Replica circuits that match delays of input and output pads carrying the feedback calibration clock from a different die or package can also be used to accurately calculate adjustment delay for multiple dies within package and for multiple packages.

The replica transmit driver 35 and the replica receive driver 36 for the working transmit drivers 29, 31, 33 and the working receive drivers 30, 32, 34 are made by matching the delay of the replica drivers with the delay of the working drivers 29, 31, and 33 over process, voltage and temperature for the worst case conditions. The transmit drivers 29, 31, 33 are also matched to each other and to the replica transmit driver 35, allowing the existence of only one replica transmit driver 35 in this preferred embodiment. The same is true of the receive drivers 30, 32, 34, whose delays are matched among themselves and to the delay of the replica receive driver 36.

In order to test the replica drivers 35, 36, the Sys clk is first passed through the replica drivers 35, 36, and then through the first multiplexer 18. Then the Sys clk is passed directly through the first multiplexer 18. The selection of the inputs to multiplexer 18 is controlled by the generic controller 100.

In both cases, the Sys clk is routed from the multiplexer 18 through the same, drivers, interconnection channels and multiplexers as the output clocks. The difference in delay is assumed to be a combination of the delays in the replica transmit driver 35 and the replica receive driver 36, which should match the delay of the transmit drivers 29, 31, 33 and the receive drivers 30,32, 34.

When clocks from an external device (whether in the same package or from a different package) need to be aligned, it is important to measure the delay through the pads since the delay can significantly vary with voltage and temperature variations. For this reason a replica input pad 37 is made to match input pads 25, 27 and replica output pad 38 to match output pads 26, 28. The input and output pads are shown in the form of buffers whose characteristics match those of their corresponding working pads. The measurement of the delay through the replica pad 37, 38 is done the same way as with the replica transmit and receive driver 35, 36, namely by passing the Sys clk selectively through the replica input pad 37 and the replica output pad 38 and comparing the delay incurred by Sys clk, received at reference clock sampling module 4 to the case when the Sys clkclock is passed directly through the first multiplexer 18.

The delay through the interconnection lines 50, 51 can be measured as well. The measurement is based on measuring the round trip delay by sending the Sys clk through the interconnection lines 50, 51 through the Tx part of the Tx/Rx drivers 21, 22, 23, 24, back through the first multiplexer 18, through the RX part of the Tx/Rx drivers 23, 24, the second multiplexer 17 and the RX part of the Tx/Rx drivers 21, 22, to be sent through the last multiplexer 16 before reaching the reference clock sampling module 4.

The delay measured by the feedback calibration PLL 9 is compared to the delay obtained when the Sys clk is directly sent through the last multiplexer 16 before reaching the reference clock sampling module 4.

Half of the delay difference is assumed to be the interconnection delay between the first multiplexer 18 and the reference clock sampling module 4. Using half of the total delay is the best approximation since there is no mechanism to determine transmit vs. receive side of the delay so the best solution is to match the transmit and receive sides of the transmission path and assume that the round trip delay is twice the delay in one direction.

For more accurate measurement, the Sys clock may be routed via Tx/Rx drivers 21, 22, through multiplexer 18, and then back via Tx/Rx drivers 21, 22, before being passed via multiplexer 16 to the reference clock sampling module 4. This enables calculation of the delay between the second multiplexer 17 and the reference clock sampling module 4, determined by using half of the delay difference.

Embodiments of the invention permit accurate alignment among output clocks and between selected reference clock and any output clock, regardless of input and output pin type, over voltage and temperature variations due to the use of replica circuits. Accurate alignment among output clocks and between a selected reference clock and any output clock within same package may be achieved without using additional package pins. Accurate alignment may be achieved among output clocks distributed among multiple packages and between the selected reference clock and any output clock from different packages.

The measurement of the replica and the interconnection delay is preferably performed with the feedback calibration PLL 9 as often as the measurement of phase position of the output clocks, but it is not necessary to measure it separately for each output clock phase position measurement. The final delay adjustment information for each output clock, which is taken from the output of the loop filter 12 of the feedback calibration PLL 9 to the delay control module 10 is calculated as the difference between the delay of a particular output clock and the sum of the replica and the interconnection delays.

The delay control module 10 divides the delay into predetermined coarse and fine portions, passing the coarse delay adjustment value to the output divider 15, while the fine delay adjustment value is passed to the DCO 13 to achieve the desired output clock alignment.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor.

The invention claimed is:

1. A multi-channel phase locked loop (PLL) device, comprising:
   a plurality of PLL channels, each comprising a digitally controlled oscillator (DCO) supplying an output clock, via an output divider, to a respective output pin;
   a first multiplexer for selecting any of said PLL channels for alignment;
   a feedback calibration PLL responsive to a feedback signal derived from a said output clock of a selected channel at the respective output pin; and
   a delay control module responsive to an output of the feedback calibration PLL to adjust a phase of said output clock.

2. The multi-channel PLL device as claimed in claim 1, wherein said multiplexer is configured to select said PLL channels for alignment in a time division multiplexed fashion.

3. The multi-channel PLL device as claimed in claim 1, wherein said delay control module is responsive to the output of said feedback calibration PLL to effect coarse alignment of the output clock by controlling the output divider of the selected channel and to effect fine alignment of the output clock by controlling the DCO of the selected channel.

4. The multi-channel PLL device as claimed in claim 1, further comprising a reference sampling module for sampling the feedback signal and outputting a phase value as an input to the feedback calibration PLL.

5. The multi-channel PLL device as claimed in claim 1, further comprising a transmit driver directly coupled to said output pin and a receive driver directly coupled to said first multiplexer with an interconnection line between said transmit driver and said receive driver for each said channel, a replica transmit driver in series with a receive driver coupled to an input of said first multiplexer, said replica transmit and receive drivers matching delays of said transmit and receive drivers between said channels and said first multiplexer, said replica transmit driver being responsive to a clock input to permit the delay introduced by the transmit and receive drivers to be determined.

6. The multi-channel PLL device as claimed in claim 5, wherein said replica transmit driver is coupled to a system clock driving said multi-channel PLL and said system clock is also directly coupled to an input of said first multiplexer.

7. The multi-channel PLL device as claimed in claim 5, further comprising a second multiplexer having one input coupled to an output of said first multiplexer and additional inputs coupled to input and output pads for connection to external devices, and replica input and output pads coupled to inputs of said first multiplexer, said replica input and output pads matching delays of said input and output pads for connection to external devices and being coupled to the system clock, and wherein said system clock is also coupled to an input of said first multiplexer to permit delays introduced by said input and output pads for connection to external devices to be determined.

8. The multi-channel PLL device as claimed in claim 5, further comprising a second multiplexer, a forward and return path between said first and second multiplexers, said first multiplexer having an input coupled to an output of the return path, and said system clock being configured to send clock signals on a round trip over said return path, and back through said first multiplexer, said forward path, and said second multiplexer to determine delays introduced by said forward and return paths.

9. The multi-channel PLL device as claimed in claim 8, further comprising a third multiplexer having a first input coupled to an output of said second multiplexer and a second input coupled to a system clock, an output of said third multiplexer being coupled to an input of a reference clock sampling module providing an input to said feedback calibration PLL.

10. The multi-channel PLL device as claimed in claim 9, further comprising a fourth multiplexer between said first multiplexer and said second multiplexer, an output of said fourth multiplexer being connected to an input of said second multiplexer, a first input of said fourth multiplexer being coupled to an output of said first multiplexer through an interconnection path, and a second input of said fourth multiplexer being coupled to said output of said first multiplexer through a divider, whereby the divider can be selectively coupled into and out of the connection path between said first and second multiplexers to permit a delay introduced by said divider to be determined.

11. The multi-channel PLL device as claimed in claim 1, wherein said first multiplexer is configured to select different outputs within a said PLL channel.

12. A method of aligning output clocks in a multi-channel phase locked loop (PLL), each channel comprising a digitally controlled oscillator (DCO) supplying an output clock, via an output divider, to a respective output pin comprising:
  selecting said PLL channels for compensation in turn;
  sending a feedback signal derived from an output clock of a selected channel at a respective output pin to a feedback calibration PLL; and
  adjusting the phase of the output clock of the selected channel with a delay control module responsive to an output of the feedback calibration PLL.

13. The method as claimed in claim 12, wherein the PLL channels are selected for alignment in a time division multiplexed fashion.

14. The method as claimed in claim 12, wherein said delay control module effects coarse alignment of the output clock by controlling the output divider of the selected channel and fine alignment of the output clock by controlling the DCO of the selected channel.

15. The method as claimed in claim 12, wherein a transmit driver is directly coupled to said output pin and a receiver driver directly coupled to an input of said first multiplexer with an interconnection line between said transmit driver and said receive driver for each said channel, a replica transmit driver is provided in series with a receive driver coupled to an input of said multiplexer, said replica transmit and receive drivers matching delays of said transmit and receive drivers between said respective channels and said multiplexer, and wherein:
  a known clock input is selectively applied to an input of said first multiplexer through said replica transmit and receive drivers, and directly to another input of said first multiplexer, to determine the delay introduced by said transmit and receive drivers.

16. The method as claimed in claim 15, wherein said known clock is a system clock.

17. The method as claimed in claim 15, wherein a second multiplexer has one input coupled to an output of said first multiplexer and additional inputs coupled to input and output pads for connection to external devices, replica input and output pads are coupled to inputs of said first multiplexer, said replica input and output pads matching delays of said input and output pads for connection to external devices; and wherein:
  a system clock is selectively applied directly to an input of said first multiplexer and to another input of said first multiplexer through said replica input and output pads to permit delays introduced by said input and output pads for connection to external devices to be determined.

18. The method as claimed in claim 15, wherein a second multiplexer has one input coupled to an output of said first multiplexer, and a forward and return path are provided between said first and second multiplexers; and wherein:
  system clock signals are sent on a round trip over said return path, and back through said first multiplexer, said forward path, and said second multiplexer to determine delays in interconnection lines.

19. A method of aligning output clocks in a multi-channel phase locked loop (PLL), each channel comprising a digitally controlled oscillator (DCO) supplying an output clock, via an output divider, to a respective output pin comprising:
  selecting said PLL channels for compensation in turn;
  sending a feedback signal derived over a feedback path from an output clock of a selected channel at the respective output pin to a feedback calibration PLL;
  adjusting the phase of the output clock of the selected channel with a delay control module responsive to an output of the feedback calibration PLL;
  determining the delay of components in the feedback path by passing known signals through replica components matched to the components in the feedback path and bypassing the replica components; and
  allowing for the determined delay when adjusting the phase of the output clock.

20. The method as claimed in claim 19, further comprising passing clock signals over matched forward and return interconnection lines in said feedback path to determine the delay introduced by said connection lines.

21. The method as claimed in claim 20, wherein the delay introduced by the interconnection lines is computed as one half the round-trip delay over said forward and return interconnection lines.

22. The method as claimed in claim 20, wherein the phase of the output clock is adjusted by an amount equal to the delay measured by the feedback calibration PLL when the output clock is passed to the input of the feedback calibration module less the sum of the delay introduced by said components as determined by said replica components and the determined delay introduced by said interconnection lines.

* * * * *